United States Patent
Lee

(10) Patent No.: US 8,116,828 B2
(45) Date of Patent: Feb. 14, 2012

(54) CURRENT CONSUMPTION CONTROLLING APPARATUS AND METHOD IN PORTABLE TERMINAL

(75) Inventor: Ju-Byung Lee, Yongin-si (KR)

(73) Assignee: Samsung Electronics Co., Ltd (KR)

( * ) Notice: Subject to any disclaimer, the term of this patent is extended or adjusted under 35 U.S.C. 154(b) by 1042 days.

(21) Appl. No.: 12/026,104

(22) Filed: Feb. 5, 2008

(65) Prior Publication Data

US 2008/0268919 A1    Oct. 30, 2008

(30) Foreign Application Priority Data

Apr. 30, 2007    (KR) .................. 10-2007-0041756

(51) Int. Cl.
*H04B 1/38* (2006.01)

(52) U.S. Cl. ........ 455/574; 455/13.4; 370/318; 375/297

(58) Field of Classification Search ............ 455/574, 455/13.4; 370/318; 375/297
See application file for complete search history.

(56) References Cited

U.S. PATENT DOCUMENTS

| | | | |
|---|---|---|---|
| 7,526,261 B2* | 4/2009 | Sorrells et al. ............. | 455/127.3 |
| 7,643,848 B2* | 1/2010 | Robinett ..................... | 455/552.1 |
| 7,860,467 B2* | 12/2010 | Pan ............................ | 455/127.1 |
| 2005/0048932 A1* | 3/2005 | Balasubramaniyan et al. | 455/93 |
| 2007/0082622 A1* | 4/2007 | Leinonen et al. ............... | 455/78 |
| 2007/0238483 A1* | 10/2007 | Boireau et al. ............. | 455/553.1 |

FOREIGN PATENT DOCUMENTS

KR    1020010076827    8/2001

* cited by examiner

*Primary Examiner* — Jinsong Hu
*Assistant Examiner* — Qun Shen
(74) *Attorney, Agent, or Firm* — The Farrell Law Firm, P.C.

(57) ABSTRACT

A current consumption controlling apparatus and method in a portable terminal are provided. The apparatus includes a first transceiver for outputting a signal indicative of a transmit burst time of a first communication system mode supported by the first transceiver to a second transceiver, and adjusting a gain of a power amplifier by receiving a signal indicative of a transmit burst time of a second communication system mode from the second transceiver; and the second transceiver for outputting the signal indicative of the transmit burst time of the second communication system mode to the first transceiver, and adjusting a gain of a power amplifier by receiving the signal indicative of the transmit burst time of the first communication system mode.

9 Claims, 3 Drawing Sheets

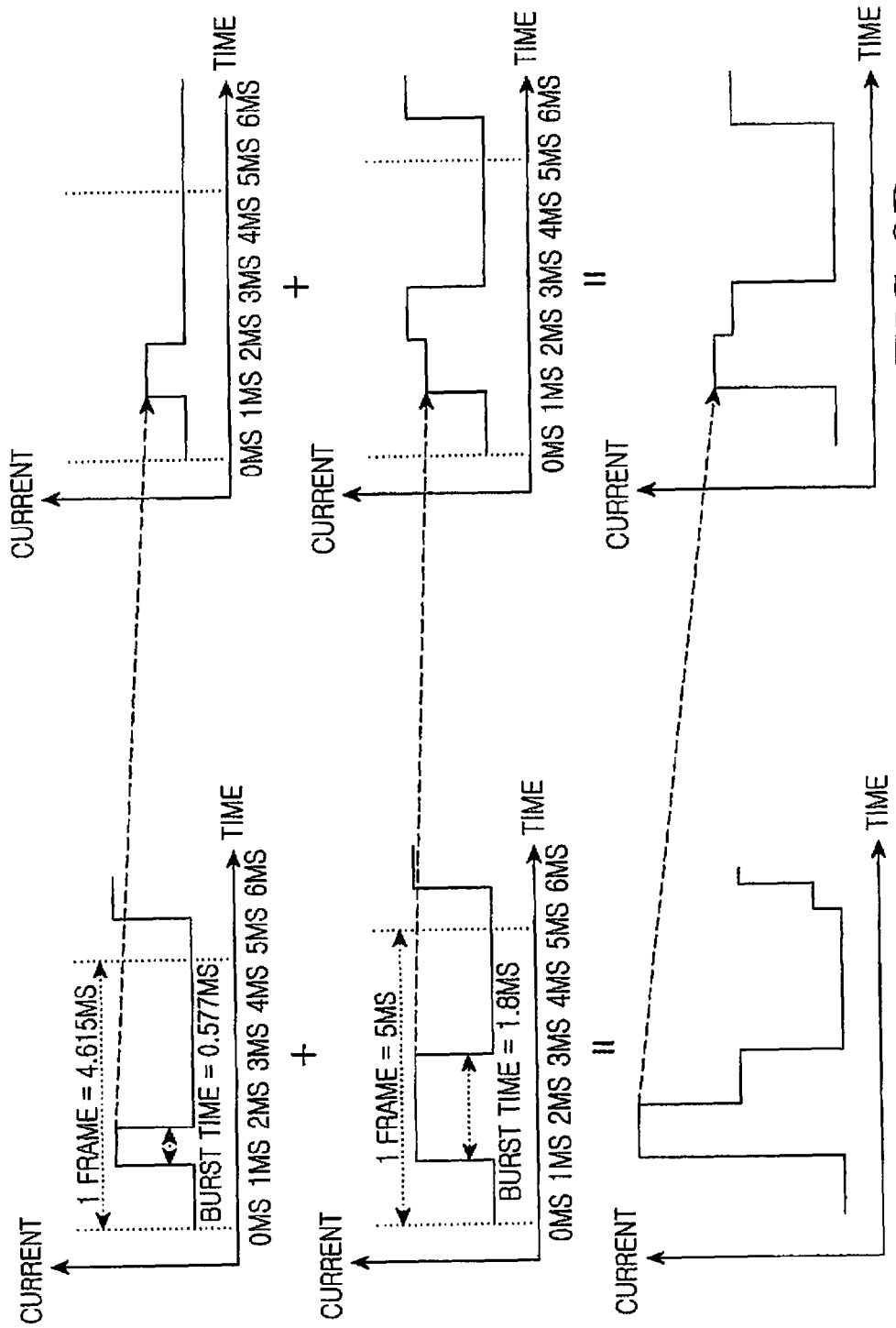

CURRENT CONSUMPTION CONTROLLING APPARATUS AND METHOD IN PORTABLE TERMINAL

PRIORITY

This application claims priority under 35 U.S.C. §119(a) to an application filed in the Korean Intellectual Property Office on Apr. 30, 2007, and assigned Serial No. 2007-41756, the contents of which are incorporated herein by reference.

BACKGROUND OF THE INVENTION

1. Field of the Invention

The present invention relates generally to a current consumption controlling apparatus and method of a dual-mode portable terminal, and, in particular, to an apparatus and method for reducing current consumption when transmit burst times of two transceivers overlap each other.

2. Description of the Related Art

A conventional portable terminal which supports a plurality of communication systems operates in only one communication mode, and not simultaneously in two communication modes, through the handoff from a mode which supports one communication system to a mode which supports another communication system. However, a recent portable terminal is required to operate in two communication modes which support different communication systems and to support the handoff between the different communication systems; that is, the vertical handoff.

Typically, a portable terminal adopting a Time Division Duplex (TDD) scheme consumes a relatively high amount of current at a specific moment. For example, when a transceiver of the portable terminal adopting the TDD scheme transmits one frame, the current consumption abruptly increases during a transmit burst time, as shown in FIG. 1A.

When the portable terminal supports two communication modes at the same time, the instant in which the greatest current consumption occurs of the TDD based portable terminal in the transmit burst time may cause a problem. In particular, when the two communication modes of the portable terminal operate at the same time and their two transceivers enter the transmit burst time, the current consumed by the transceivers is likely to increase in a moment. For example, when a TDD based portable terminal, which supports a Global System for Mobile communication (GSM) network and a Wireless Broadband (WiBro) network, operates in the GSM mode, considerable current is consumed during the GSM transmit burst time, as shown in FIG. 1A. When the portable terminal operates in the WiBro mode, considerable current is consumed during the WiBro transmit burst time, as shown in FIG. 1B. In this situation, when the TDD based portable terminal supports the GSM network and the WiBro network at the same time and accordingly the transmit burst times of the two transceivers overlap each other, all of the current consumptions of the respective modes simultaneously occurs. As a result, the excessive current consumption is caused, as shown in FIG. 1C. As such, the amount of the current excessively consumed by the two transceivers in an instant exceeds the capability of the portable terminal, to thus deteriorate the stability and the reliability of the portable terminal.

SUMMARY OF THE INVENTION

An aspect of the present invention is to substantially solve at least the above problems and/or disadvantages and to provide at least the advantages below. Accordingly, an aspect of the present invention is to provide a current consumption controlling apparatus and method of a portable terminal.

Another aspect of the present invention is to provide an apparatus and method for controlling current consumption when transmit burst times of two TDD transceivers overlap each other in a dual-mode portable terminal.

A further aspect of the present invention is to provide an apparatus and method for restricting current consumption by adjusting a gain of a power amplifier in a dual-mode portable terminal.

The above aspects are achieved by providing a current consumption controlling apparatus of a portable terminal which supports a plurality of communication systems. The apparatus includes a first transceiver for outputting a signal indicative of a transmit burst time of a first communication system mode supported by the first transceiver to a second transceiver, and adjusting a gain of a power amplifier by receiving a signal indicative of a transmit burst time of a second communication system mode from the second transceiver; and the second transceiver for outputting the signal indicative of the transmit burst time of the second communication system mode to the first transceiver, and adjusting a gain of a power amplifier by receiving the signal indicative of the transmit burst time of the first communication system mode.

According to one aspect of the present invention, a current consumption controlling method of a portable terminal which supports a plurality of communication systems, includes determining, at each transceiver, occurrence of a transmit burst time of a communication system mode supported by the transceiver and informing to a correspondent transceiver; and receiving, at each transceiver, information relating to the transmit burst time from the correspondent transceiver and adjusting a of a power amplifier gain.

BRIEF DESCRIPTION OF THE DRAWINGS

The above and other objects, features and advantages of the present invention will become more apparent from the following detailed description when taken in conjunction with the accompanying drawings in which:

FIGS. 3A and 3B are graphs of a current consumption when the portable terminal operates in a dual mode according to the present invention.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

The present invention provides an apparatus and method for restricting current consumption by adjusting a gain of a power amplifier when transmit burst times of two transceivers overlap each other in a dual-mode portable terminal.

Figure 1A:
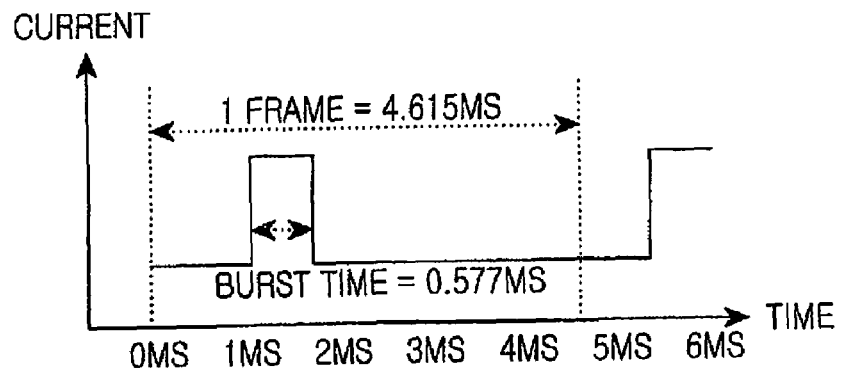
FIGS. 1A, 1B and 1C are graphs of a current consumption when a conventional portable terminal operates in a dual mode.
Figure 1B:
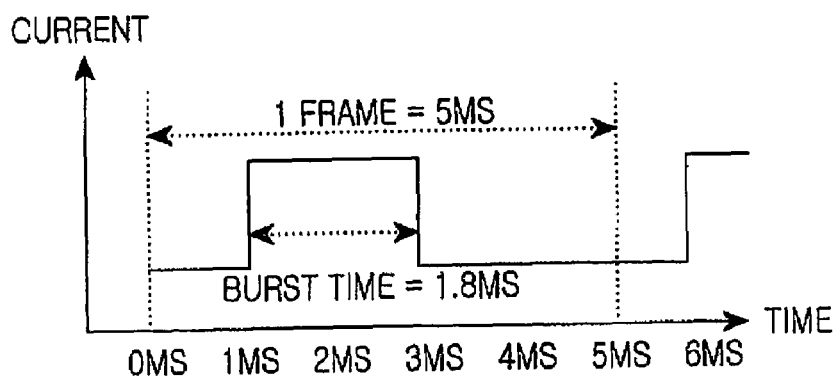
Figure 1C:
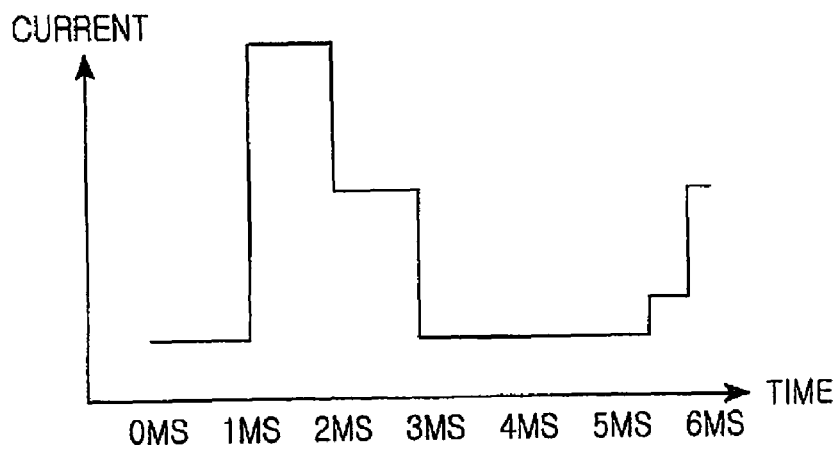
Figure 2:
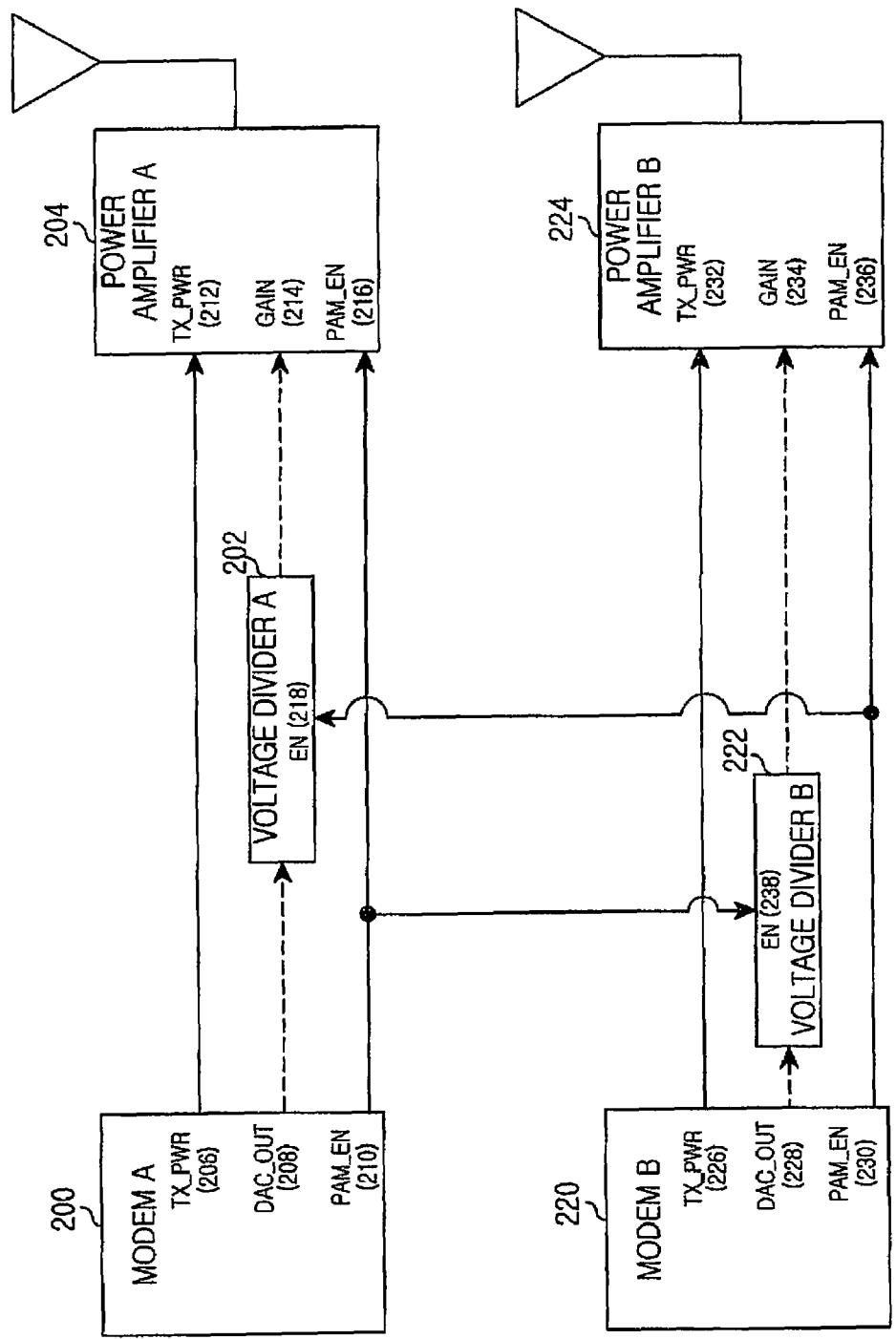
FIG. 2 is a block diagram of a portable terminal for controlling the current consumption according to the present invention.

FIG. 2 is a block diagram of a portable terminal for controlling the current consumption according to the present invention. The portable terminal includes two transceivers A and B (not shown). Transceiver A includes a modem A 200, a voltage divider A 202, and a power amplifier A 204. Transceiver B includes a modem B 220, a voltage divider B 222, and a power amplifier B 224.

The modem A 200 in FIG. 2 modulates coded data to be transmitted to a base station or demodulates data received from the base station. Particularly, the modem A 200 includes a TX_PWR port 206, a DAC_OUT port 208, and a PAM_EN port 210 to output a signal for adjusting a gain of the power amplifier 204 over a transmit burst time of its communication mode. In more detail, the modem A 200 outputs the modulated signal through the TX_PWR port 206. The modem A 200 generates a voltage signal for adjusting the gain of the power amplifier 204 according to the transmission level and outputs the voltage signal through the DAC_OUT port 208. The modem A 200 generates a voltage signal indicative of the transmit burst time of its communication mode and outputs the voltage signal through the PAM_EN port 210. Herein, the modem A 200 can generate and output a high signal only in the transmit burst time of its communication mode.

The voltage divider A 202 differently processes a gain adjustment signal input from the DAC_OUT port 208 of the modem A 200 according to a signal input to an EN port 218 from the PAM_EN port 230 of the modem B 220. When the signal input to the EN port 218 indicates the transmit burst time of the communication mode supported by the modem B 220, the voltage divider A 202 lowers the voltage by dividing the voltage of the gain adjustment signal and outputs the lowered voltage to the power amplifier A 204. By contrast, when the signal input to the EN port 218 indicates non transmit burst time of the communication mode supported by the modem B 220, the voltage divider A 202 bypasses and forwards the gain adjustment signal to the power amplifier A 204.

The power amplifier A 204 converts the low signal to a high signal. That is, the power amplifier A 204 amplifies the voltage or the power of the signal fed to the input stage and outputs the high energy change to the output stage. According to the present invention, the power amplifier A 204 converts the magnitude of the signal input to the TX_PWR port 212 according to the gain adjustment signal input to the GAIN port 214. Herein, the amount of current consumed by the power amplifier A 204 varies depending on the magnitude of the gain adjustment signal.

The modem B 220 modulates coded data to be transmitted to the base station or demodulates data received from the base station. Particularly, the mode B 220 includes a TX_PWR port 226, a DAC_OUT port 228, and a PAM_EN port 230 to output a signal for adjusting the gain of the power amplifier 224 during the transmit burst time of its communication mode. In particular, the modem B 220 outputs the modulated signal through the TX_PWR port 226. The modem B 220 generates a voltage signal for adjusting the gain of the power amplifier 224 according to the transmission level and outputs the voltage signal through the DAC_OUT port 228. The modem B 220 generates a voltage signal indicative of the transmit burst time of its communication mode and outputs the voltage signal through the PAM_EN port 230. Herein, the modem B 220 can generate a high signal only in the transmit burst time of its communication mode and output the high signal to the PAM_EN port 230.

The voltage divider B 222 differently processes the gain adjustment signal input from the DAC_OUT port 228 of the modem B 220 according to the signal input from the PAM_EN port 210 of the modem A 200 to the EN port 238. When the signal input to the EN port 238 indicates the transmit burst time of the communication mode supported by the modem A 200, the voltage divider B 222 lowers the voltage to a proper value by dividing the voltage of the gain adjustment signal and outputs the lowered voltage to the power amplifier B 224. By contrast, when the signal input to the EN port 238 indicates non transmit burst time of the communication mode supported by the modem A 200, the voltage divider B 222 bypasses and forwards the gain adjustment signal to the power amplifier B 224.

The power amplifier B 224 converts the low signal to a high signal and outputs the high signal. That is, the power amplifier B 224 amplifies the voltage or the power of the signal fed to the input stage and outputs the high energy change to the output stage. According to the present invention, the power amplifier B 224 converts the magnitude of the signal input to the TX_PWR port 232 according to the gain adjustment signal input to the GAIN port 234. Herein, the amount of current consumed by the power amplifier B 224 differs depending on the magnitude of the gain adjustment signal.

The operation of the structure of FIG. 2 is explained in further detail.

When only one of the two transceivers A and B operates, the corresponding voltage divider operates 1~A bypass mode. Accordingly, the power amplifier receives the normal voltage; that is, receives the gain adjustment signal and performs the normal operation.

When the two transceivers A and B operate at the same time, with transceiver A in the transmit burst time, and transceiver B in the receive burst time, modem B 220 of transceiver B outputs a low signal indicative of non transmit burst time to the PAM_EN port 230 and accordingly voltage divider A 202 of transceiver A bypasses. Hence, the power amplifier A 204 receives the normal voltage signal and performs the normal operation.

When the two transceivers A and B operate at the same time, with transceiver A in the receive burst time, and transceiver B in the transmit burst time, modem A 200 of the transceiver A outputs a low signal indicative of non transmit burst time to the PAM_EN port 210 and accordingly voltage divider B 222 of transceiver B bypasses. Hence, the power amplifier B 204 receives the normal voltage signal and performs the normal operation.

When both of the two transceivers A and B operate in the transmit burst time at the same time, the modem A 200 of transceiver A outputs a high signal indicative of the transmit burst time to the PAM_EN port 210. Accordingly, the voltage divider B 222 of transceiver B lowers the gain of the power amplifier B 224 and the power amplifier B 224 amplifies the signal according to the reduced gain. The modem B 220 of transceiver B outputs a high signal indicative of the transmit burst time to the PAM_EN port 230. Hence, the voltage divider A 202 of transceiver A reduces the gain of the power amplifier A 204 and the power amplifier A 204 amplifies the signal according to the reduced gain. Herein, as the gains of the power amplifiers A 204 and B 224 are reduced, the power consumption at the power amplifiers A 204 and B 224 also decreases.

FIGS. 3A and 3B are graphs of a current consumption when the portable terminal operates in the dual mode according to the present invention. The horizontal axis indicates time and the vertical axis indicates power consumption.

FIG. 3A shows current consumption when the transmit burst times of the two conventional transceivers overlap each other, and FIG. 3B shows the current consumption when the gain of the power amplifier is adjusted in the overlapping period of the transmit burst times of the two transceivers according to the present invention.

In the related art of FIG. 3A, when the transmit burst time of one transceiver ranges between 1~2 ms and the transmit burst time of the other transceiver ranges between 1~3 ms, the transmit burst times overlap each other during the time period of between 1~2 ms and the current consumption during the time period abruptly increases.

In contrast, when the gain of the power amplifier is adjusted during the overlapping time period of between 1~2 ms of the transmit burst times, the current consumption at the respective transceivers decreases and thus the total current consumption of the portal terminal decreases, as shown in FIG. 3B.

Alternate embodiments of the present invention can also comprise computer readable codes on a computer readable medium. The computer readable medium includes any data storage device that can store data that can be read by a computer system. Examples of a computer readable medium include magnetic storage media (such as ROM, floppy disks, and hard disks, among others), optical recording media (such as CD-ROMs or DVDs), and storage mechanisms such as transmission through the Internet. The computer readable medium can also be distributed over network coupled computer systems so that the computer readable code is stored and executed in a distributed fashion. Also, functional programs, codes, and code segments for accomplishing the present invention can be construed by programmers of ordinary skill in the art to which the present invention pertains.

As described above, the gain of the power amplifier is lowered during the overlapping time period of the transmit burst times of the two transceivers of the portable terminal, to prevent the excessive momentary current consumption of the portable terminal.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A current consumption controlling apparatus of a portable terminal which supports a plurality of communication systems, the apparatus comprising:
   a first transceiver for outputting a signal indicative of a transmit burst time of a first communication system mode supported by the first transceiver to a second transceiver, and adjusting a gain of a power amplifier by receiving a signal indicative of a transmit burst time of a second communication system mode from the second transceiver; and
   the second transceiver for outputting the signal indicative of the transmit burst time of the second communication system mode to the first transceiver, and adjusting the gain of the power amplifier by receiving the signal indicative of the transmit burst time of the first communication system mode,
   wherein the first transceiver and the second transceiver each comprises:
   a modem for outputting the signal indicative of the transmit burst time of the corresponding communication system mode supported by one of the corresponding first and second transceiver to a voltage divider of another of the corresponding first and second transceiver, being a counterpart transceiver, and outputting a signal indicative of the gain of the power amplifier to the corresponding voltage divider; and
   the voltage divider for adjusting the gain signal of the power amplifier input from the corresponding modem according to the transmit burst time signal input from the modem of the counterpart transceiver.

2. The current consumption controlling apparatus of claim 1, wherein the first transceiver and the second transceiver further comprise:
   a power amplifier for amplifying the signal input from the corresponding modem according to the gain signal adjusted at the corresponding voltage divider.

3. The current consumption controlling apparatus of claim 1, wherein, when the signal input from the modem of the counterpart transceiver indicates the transmit burst time, the voltage divider divides and lowers a voltage of the gain signal input from the corresponding modem.

4. The current consumption controlling apparatus of claim 1, wherein, when the signal input from the modem of the counterpart transceiver indicates a non transmit burst time, the voltage divider maintains a voltage of the gain signal input from the corresponding modem.

5. The current consumption controlling apparatus of claim 1, wherein the first communication system mode and the second communication system mode are a mode which supports a Global System for Mobile communication communication system and a mode which supports a WiBro communication system, respectively.

6. A current consumption controlling method of a portable terminal which supports a plurality of communication systems, the method comprising:
   determining, at each transceiver, occurrence of a transmit burst time of a communication system mode supported by the transceiver and informing to a counterpart transceiver; and
   receiving, at each transceiver, information relating to the transmit burst time from the counterpart transceiver and adjusting a gain of a power amplifier,
   wherein the adjusting of the gain of the power amplifier comprises:
   determining, at each transceiver, whether transmit burst times overlap each other by receiving the information relating to the transmit burst time from the counterpart transceiver; and
   when the transmit burst times overlap each other, lowering the gain of the power amplifier of the transceiver.

7. The current consumption controlling method of claim 6, wherein the adjusting of the gain of the power amplifier further comprises:
   when the transmit burst times do not overlap, maintaining the gain of the power amplifier of the transceiver.

8. The current consumption controlling method of claim 6, wherein the communication system modes supported by the transceivers are a mode which supports a Global System for Mobile communication communication system and a mode which supports a WiBro communication system, respectively.

9. A non-transitory computer-readable storage medium having recorded thereon a program for controlling a current consumption in a portable terminal which supports a plurality of communication systems, the medium comprising:
   a first code segment, for determining, at each transceiver, occurrence of a transmit burst time of a communication system mode supported by the transceiver and informing to a correspondent transceiver; and
   a second code segment, for receiving, at each transceiver, information relating to the transmit burst time from the counterpart transceiver and adjusting a gain of a power amplifier,
   wherein the adjusting of the gain of the power amplifier comprises:
   determining, at each transceiver, whether transmit burst times overlap each other by receiving the information relating to the transmit burst time from the counterpart transceiver; and
   when the transmit burst times overlap each other, lowering the gain of the power amplifier of the transceiver.

* * * * *